United States Patent [19]

Russell

[11] Patent Number: 5,413,970

[45] Date of Patent: May 9, 1995

[54] PROCESS FOR MANUFACTURING A SEMICONDUCTOR PACKAGE HAVING TWO ROWS OF INTERDIGITATED LEADS

[75] Inventor: Ernest J. Russell, Richmond, Tex.

[73] Assignee: Texas Instruments Incorporated, Dallas, Tex.

[21] Appl. No.: 134,149

[22] Filed: Oct. 8, 1993

[51] Int. Cl.⁶ .................. H01L 21/56; H01L 21/58; H01L 21/60
[52] U.S. Cl. .................. 437/208; 437/217; 437/220; 257/696
[58] Field of Search .......... 437/217, 220, 208; 257/696, 694, 735; 361/773, 774, 776, 813

[56] References Cited

U.S. PATENT DOCUMENTS

| | | | |
|---|---|---|---|
| 2,734,151 | 7/1956 | Jacobs | 361/776 |
| 3,524,108 | 10/1970 | English | 361/773 |
| 4,967,262 | 10/1990 | Farnsworth | 257/696 |
| 4,975,763 | 12/1990 | Baudouin et al. | 361/397 |
| 5,204,287 | 4/1993 | McLellan et al. | 437/217 |
| 5,275,975 | 1/1994 | Baudouin et al. | 437/217 |
| 5,305,179 | 4/1994 | Sono et al. | 361/776 |

FOREIGN PATENT DOCUMENTS

| | | | |
|---|---|---|---|
| 63-79361 | 4/1988 | Japan | 257/696 |
| 1-23560 | 1/1989 | Japan | 257/696 |
| 1-230265 | 9/1989 | Japan | 257/696 |
| 3-149898 | 6/1991 | Japan | 361/813 |
| 4-23460 | 1/1992 | Japan | 257/696 |

*Primary Examiner*—Olik Chaudhuri
*Assistant Examiner*—David E. Graybill
*Attorney, Agent, or Firm*—William W. Holloway; Lawrence J. Bassuk; Richard L. Donaldson

[57] ABSTRACT

A process for manufacturing a semiconductor package having two rows of interdigitated leads. The two rows of leads (14, 16) are affixed on and extend from one side of the semiconductor package (10). The two rows of leads (14, 16) are interdigitated with each other in a non-contacting manner. The end portions of the leads (17) are further shaped to form a contact surface for soldering to electrical conductors on a printed circuit board.

4 Claims, 4 Drawing Sheets

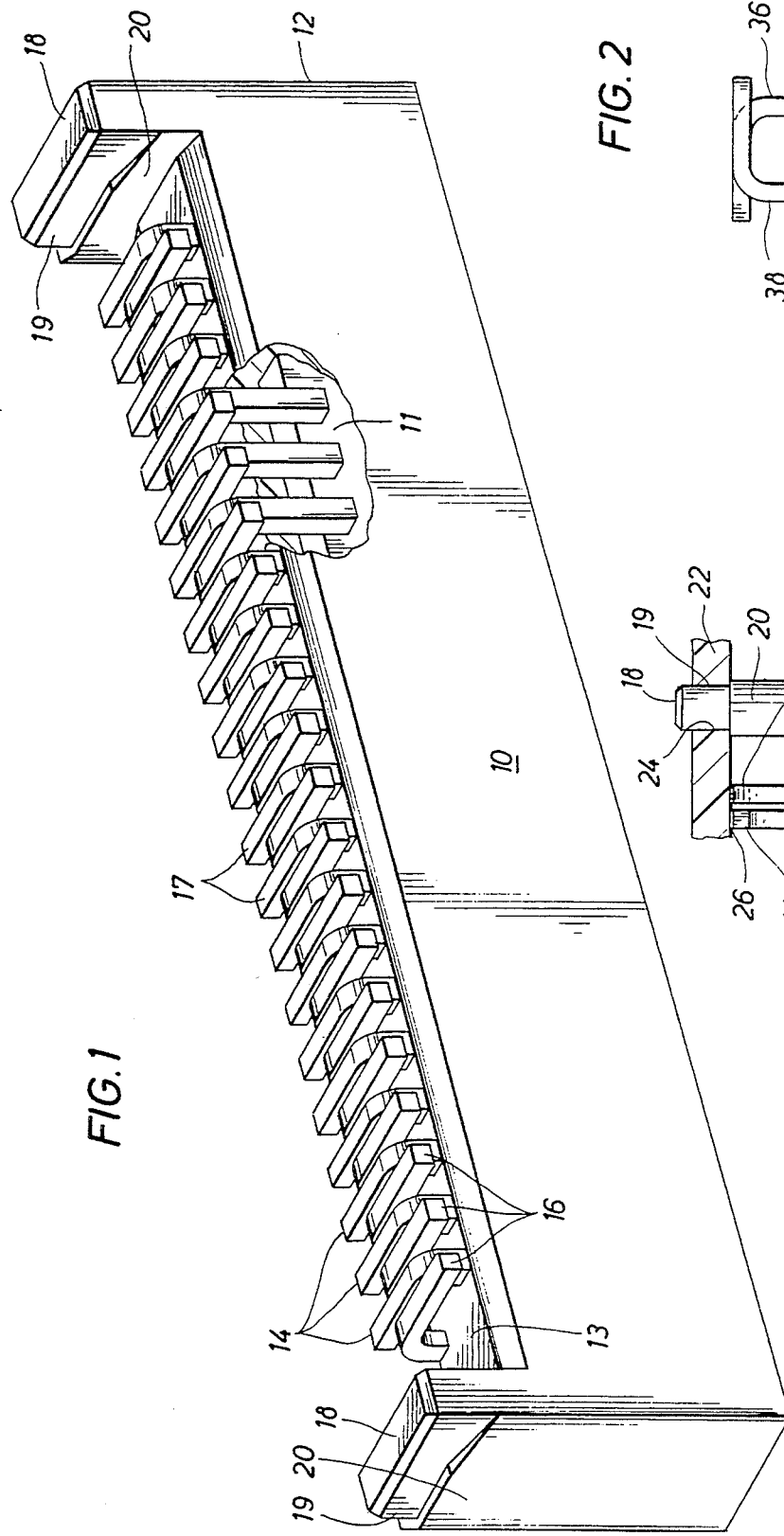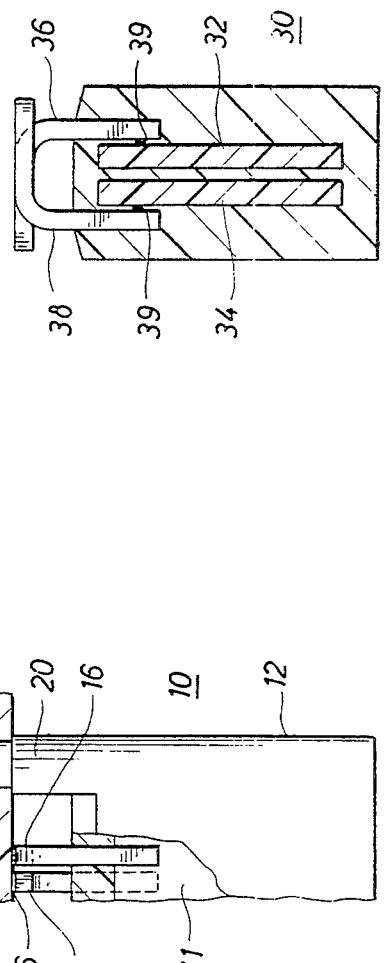

PROCESS FOR MANUFACTURING A SEMICONDUCTOR PACKAGE HAVING TWO ROWS OF INTERDIGITATED LEADS

CROSS-REFERENCE TO RELATED APPLICATIONS

Concurrently filed U.S. patent application Ser. No. 08/134,035, filed Oct. 8, 1993, assigned to the assignee of this application, and entitled "High Density Semiconductor Package" is hereby incorporated by reference.

TECHNICAL FIELD OF THE INVENTION

This invention relates in general to the field of semiconductor packages and, more particularly, to a method and apparatus for providing a semiconductor package having two rows of interdigitated leads.

BACKGROUND OF THE INVENTION

Semiconductor devices, such as integrated circuits and semiconductor chips, are usually encapsulated in a protective package made of plastic, metal or ceramic material. The package provides hermetic sealing and structural rigidity to the device. The package has a plurality of conductive leads extending therefrom for attachment to electrical conductors on printed circuit boards. The leads are usually made of a metal alloy and may be soldered directly on the surface of the conductor, i.e., "surface mounted" on the printed circuit board. Surface mounting of leads eliminates the need for drilling holes in the printed circuit board, and extending leads through the holes, and soldering the leads in the holes of the board. More importantly, with surface mounting, the package leads can be positioned closer together to achieve a higher component density on the printed circuit board.

To further increase component density on a printed circuit board, thin packages that are vertically mounted are utilized. Thin packages with mounting studs and leads extending from one side of the package are vertically mounted on a printed circuit board using the mounting studs. Once mounted, the leads of the thin package are surface mounted on the printed circuit board. Vertical mounting of a package will minimize the space requirement of the package on a printed circuit board and thereby increase the density of components on a printed circuit board.

A typical vertically mounted thin package has one row of leads extending from one side of the package for surface mounting on a printed circuit board. Certain applications, however, may require thin packages to have two rows of leads. For example, as disclosed in concurrently filed U.S. patent application Ser. No. 08/134,035, a high density semiconductor package encapsulating two semiconductor chips may require two rows of leads, i.e., one row of leads for each chip. In another application, two rows of leads may be required for a semiconductor package housing a large semiconductor device requiring many leads. Furthermore, twin rows of leads may be used to reduce the dimensions of a package. For example, a package having one long row of leads may be reduced in size by using two shorter rows of leads.

In the prior art, because of the thinness of the package, the leads of a typical thin package with twin rows of leads would extend beyond the "footprint" of the package, i.e., the surface area of the side of the package having the leads, when used in a surface mounted application. Therefore, the leads of a prior art thin package are flared outward and away from the package, in a gull-wing shape, in order to allow for the soldering of the leads on a printed circuit board. Such gull-wing shaped leads would require more surface area on the printed circuit board, i.e., a larger "footprint," and thus reduce the component density on the board. Therefore, a need has arisen for a thin package with twin rows of leads that do not extend beyond the footprint of the package.

SUMMARY OF THE INVENTION

In accordance with the present invention, a method and apparatus for providing a semiconductor package having two rows of interdigitated leads are disclosed. In a preferred embodiment, the two rows of conductive leads protrude and extend from one side of a package having at least one semiconductor chip encapsulated therein. Each of the leads has an encapsulated portion and an exposed portion. The encapsulated ends of the leads are electrically connected to at least one semiconductor chip in the package. The two rows of exposed leads are spaced apart and configured on the side of the package such that they are generally parallel and opposite to each other, preferably with the leads on one row facing the spacings between the leads on the opposite row. The two rows of exposed leads are bent toward each other in an interdigitated and non-contacting manner. The unconnected ends of the exposed leads are further shaped such that they form a contact surface for soldering to conductors on a printed circuit board.

An advantage of the present invention is that the leads are within the footprint of the package and that, by interdigitating the leads, the unconnected ends of the leads do not extend beyond the footprint of the package.

Another advantage of the present invention is that the leads of each row of leads maintain the same "pitch," i.e., the distance between adjacent leads of the corresponding row, as the leads of a prior art package having a single row of leads. By maintaining the same pitch, existing installation procedures may be utilized for installing and soldering the twin rows of leads on a printed circuit board.

Another advantage of the present invention is that the leads are less prove to damage during shipping, handling, and assembling because the leads are positioned within the footprint of the package.

BRIEF DESCRIPTION OF THE DRAWINGS

For a more complete understanding of the present invention and the advantages thereof, reference is now made to the following descriptions taken in conjunction with the accompanying drawings in which like reference numbers indicate like features and wherein:

FIG. 1 is an overall view of an embodiment of the present invention depicting a thin package with twin rows of interdigitated leads;

FIG. 1a is a close-up view of one section of the package shown in FIG. 1 in a surface mounted position on a printed circuit board;

FIG. 2 is a cross-sectional view of a twin-row leaded thin package housing two chips;

DETAILED DESCRIPTION OF THE INVENTION

Figure 3:
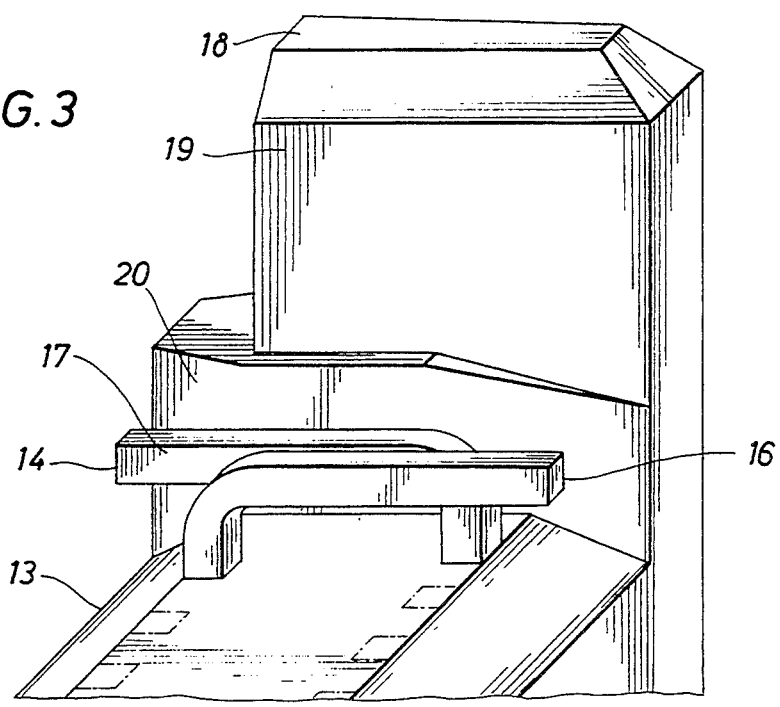
FIG. 3 is a close-up view of one pair of the interdigitated leads on the package in FIG. 1.

FIG. 1 illustrates a semiconductor package 10 for housing an integrated circuit or semiconductor chip 11. The package may be composed of injection-molded plastic 12, which is commonly used in the industry, to surround and encapsulate the chip 11. A first and second row of conductive leads 14, 16 are provided for electrically connecting the encapsulated chip 11 to external elements, e.g., electrical conductors on a printed circuit board (not shown). The two rows of conductive leads 14, 16 are located on and extend from one side 13 of the package 10. The conductive leads 14, 16 are typically composed of an electrically conductive metal alloy material, such as "Alloy 42," which is commonly used in the industry for package leads. The leads 14, 16 are electrically connected to the chip 11 using conventional industry techniques. For example, the leads may be soldered to electrical contacts called "bumps" on the chip or, alternatively, the leads may be wired to the "bonding pads" on the chip using conventional wire bonding techniques.

A pair of protruding studs or positioners 18 is provided, as illustrated in FIG. 1, for mounting the package 10 on a printed circuit board 22, as illustrated in FIG. 1a. The positioners 18 may be composed of the same or a different type of molded plastic as that used for the package. The positioners 18 are located on opposite ends of the side 13 of the package 10 where the leads 14, 16 are affixed and extend from the side 13 of the package 10. The positioners 18 each have reduced portions 19 for insertion into holes 24 in the printed circuit board 22 where the package 10 is to be mounted. The package 10 is mechanically supported and positioned by the reduced portions 19 of the positioners 18 fitting into holes 24 in the printed circuit board 22. The positioners 18 also have enlarged shoulders or stop portions 20 for positioning the two rows of leads 14, 16 for soldering to the conductors 26 on the printed circuit board 22. As illustrated in FIG. 1a, the positioners 18 support the package 10 mounted to the printed circuit board 22 and position the two rows of leads 14, 16 for soldering to conductors 26 on the printed circuit board 22. The two rows of leads 14, 16 remain within the footprint of the package 10, as illustrated in FIG. 1.

In another embodiment, a semiconductor package may contain two chips. As disclosed in concurrently filed U.S. patent application Ser. No. 08/134,035, a twin-row leaded semiconductor package may contain more than one integrated circuit or semiconductor chip. FIG. 2 is a cross-sectional view of a semiconductor package 30 containing a first chip 32 and a second chip 34 that are positioned side by side in the package 30 and electrically isolated from each other. A first row of leads 36 is electrically connected to the first chip 32 and a second row of leads 38 is electrically connected to the second chip 34. The leads 36, 38 are electrically connected to their corresponding chips using conventional industry techniques as described above, such as "bump" connecting or wire bonding. As illustrated in FIG. 2, the leads 36, 38 are electrically connected to the chips 32, 34 via bumps 39 located on the surface of the chips 32, 34. The external appearance of the package 30 may be the same as that of the package 10 illustrated in FIG. 1.

FIG. 3 is a close-up view of the package 10 as illustrated in FIG. 1, except that, for simplicity of illustration, only one pair of opposing leads 14, 16 on the package 10 is shown. The illustrated leads 14, 16 are representative of all of the leads on their respective rows, which are not shown in FIG. 3; however, their location on the side 13 of the package 10 is shown by dashed squares. Referring to FIGS. 1 and 3, the two rows of leads 14, 16 are provided on one side 13 of the package 10. To provide leads on one side of the package, the disclosure set forth in concurrently filed U.S. patent application Ser. No. 08/134,035, entitled "High Density Semiconductor Package," may be utilized. In particular, the leads may be part of a lead frame, which is commonly used for mounting a chip in a package. To provide two rows of leads, two lead frames are required. The lead frames are positioned together and encapsulated within a package, wherein a portion of the leads extends from the encapsulated package. Referring to FIGS. 1 and 3, the first row of conductive leads 14 is mounted on one end of the side 13 of the package 10, and the second row of leads 16 is mounted on the opposite end of the side 13. The leads 14 of the first row are bent toward the second row of leads 16 and positioned interdigitatedly and non-contactingly in the spacings between the leads of the second row 16. Likewise, the leads 16 of the second row are bent toward the first row of leads 14 and positioned in the spacings between the leads 14 of the first row in an interdigitated and non-contacting manner. The spacings between adjacent leads of each row are sufficient to accommodate the leads from the opposite row in an interdigitated and noncontacting manner. The end portions 17 of the leads are further bent in a predetermined shape to form a contact surface for soldering to electrical conductors on a printed circuit board. The bending and shaping of the leads may be performed using standard semiconductor manufacturing equipment and packaging process. The shaping process may occur before or after the encapsulating of leads in the package. Therefore, each row of leads may be shaped separately or together, depending on when the shaping process is done during the packaging process.

Figure 4A:
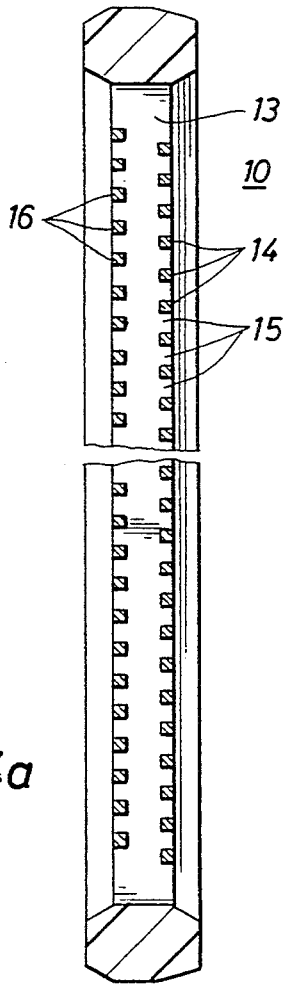
FIGS. 4a–4b are two embodiments of the present invention depicting lead layouts for thin packages with twin rows of interdigitated leads.
Figure 4B:
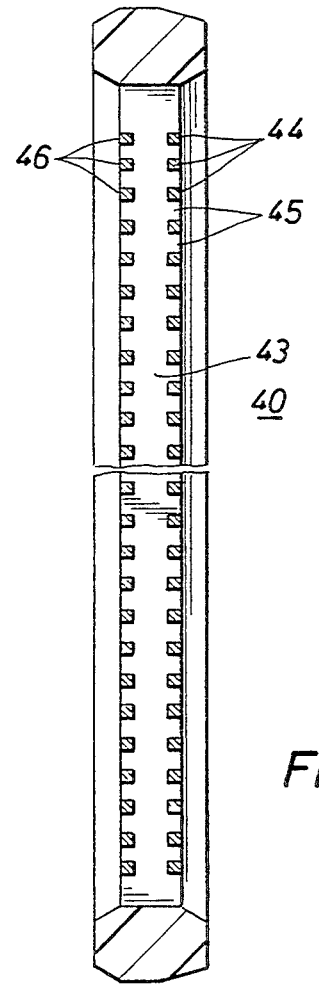
Figure 5A:
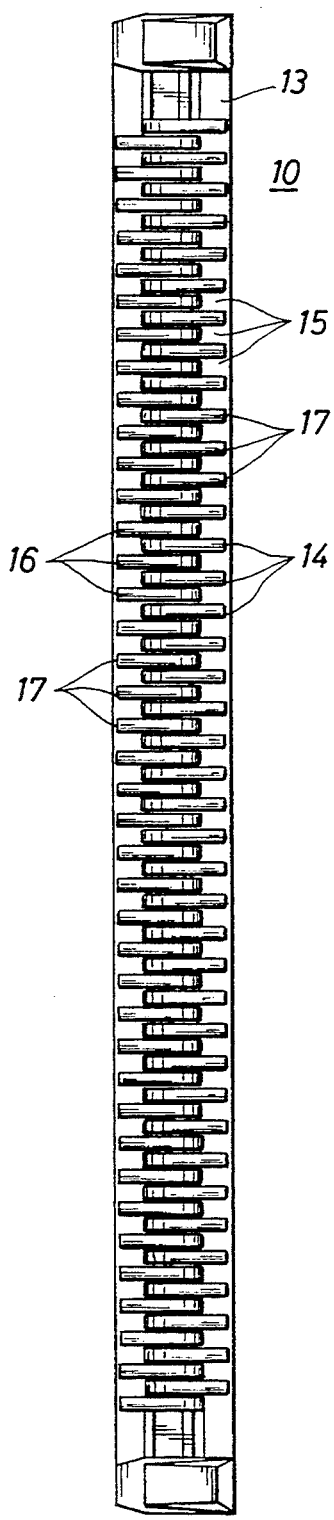
FIGS. 5a–5b illustrate the twin rows of interdigitated leads corresponding to the lead layouts of FIGS. 4a and 4b, respectively, as viewed from the mountable side of the thin package.
Figure 5B:
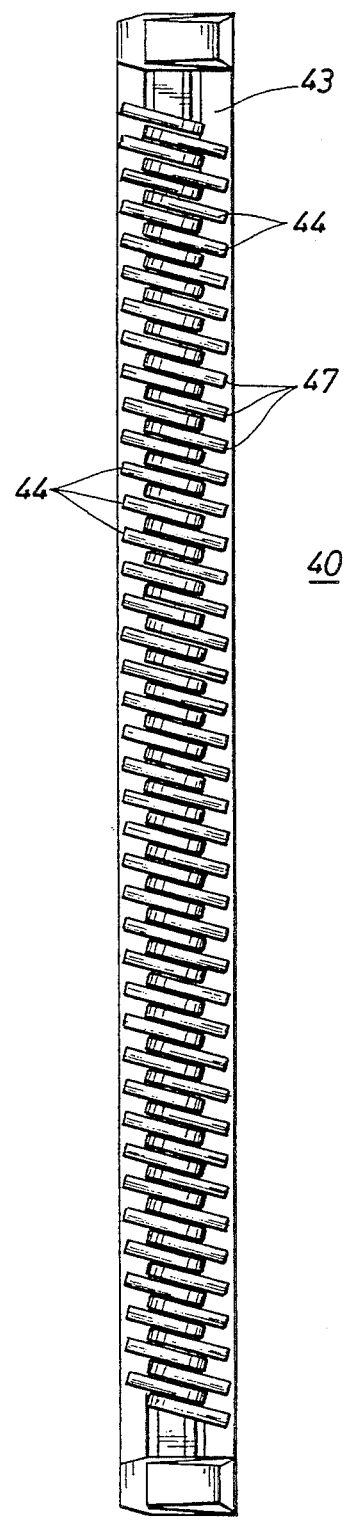

FIGS. 4a–4b illustrate two lead layouts for the packages 10 and 40 shown in FIGS. 5a and 5b, respectively. Lead layout is a cross-sectional view of the leads as they protrude from the package and illustrates the layout or arrangement of the leads on a package, e.g., the distance between the center lines of adjacent leads on a row, which is called the "pitch" of the leads, and the relationship of the two rows of leads with each other. FIGS. 4a and 4b illustrate two lead layouts for providing the interdigitating of the leads in a non-contacting manner. Referring now to the lead layout in FIG. 4a, on each row, the pitch 15 between adjacent leads 14 or 16 is the same. As further illustrated in FIG. 4a, the two rows of leads 14, 16 are shifted preferably, by a half of a pin pitch, such that the leads from one row 16 are facing the spacings, or pitch 15, between the leads 14 of the opposite row and vice versa. FIG. 4b illustrates another lead layout for a package 40 where the pitch between adjacent leads is the same and the two rows of leads are positioned opposite each other, without any shifting. To provide for the non-contacting and interdigitating of the leads, the leads 44, 46 for package 40 may be rotated by a half of a pin pitch prior to bending and shaping them in a interdigitated fashion, as further discussed below and illustrated in FIG. 5b.

FIGS. 5a–5b further illustrate the lead layouts for the interdigitating of leads on a package. FIG. 5a is a view from the bottom, i.e., mounting side 13, of the package 10 of the two rows of interdigitated leads 14, 16. The leads 14, 16 in FIG. 5a correspond to the lead layout of FIG. 4a. Referring to FIG. 5a, the leads 14, 16 on each row are bent toward the opposing row and positioned in the spacings 15 of the leads 16, 14, respectively, of the opposing row in an interdigitated and noncontacting manner. The end portions 17 of the leads are further shaped to form a contact surface for soldering to the conductors 26 on a printed circuit board 22. On each row, the pitch 15 between adjacent leads 14 or 16 remains the same. Moreover, both rows of leads 14, 16 do not extend beyond the footprint of the package 10. Referring to another lead layout embodiment, FIG. 5b is a view of the mounting side 43 of the two rows of interdigitated leads 44, 46 on the package 40. FIG. 5b corresponds to the lead layout of FIG. 4b. The leads 44, 46 are rotated by half a pin pitch and then bent toward the opposing row and interdigitated with the leads 44, 46, respectively, on the opposing row in a non-contacting manner. The end portions 47 of the leads are further shaped to form a contact surface for soldering to the conductors 26 on a printed circuit board 22. On each row, the pitch 45 between adjacent leads 44 or 46 remains the same and both rows of leads 44, 46 do not extend beyond the footprint of the package 40.

Figure 6A:
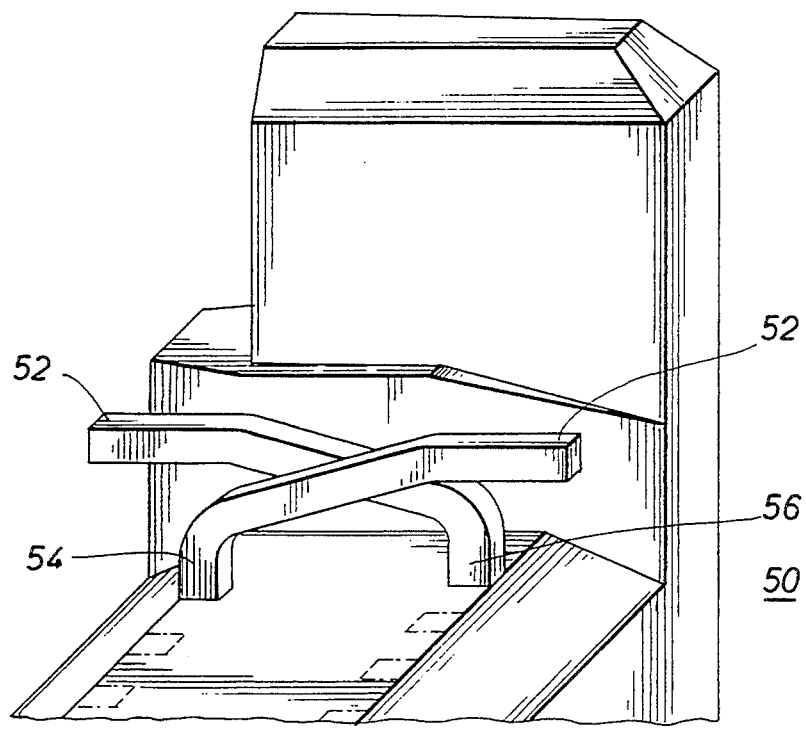
FIGS. 6a–6b are two alternative embodiments of lead shapes for use as the leads on twin-row leaded thin package embodiment of the present invention.
Figure 6B:
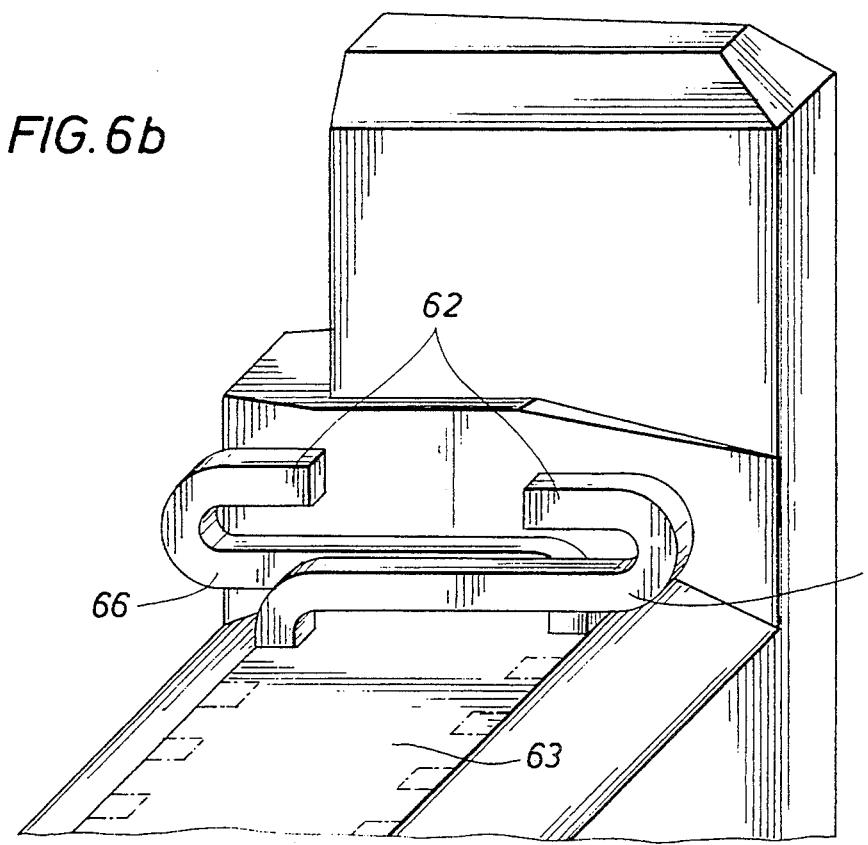

FIGS. 6a and 6b illustrate that the leads may be shaped differently to provide different lead end portion arrangements on a package. FIG. 6a illustrates one embodiment of a package 50 wherein the leads 54, 56 are bent and angled such that the end portions 52 of the leads 54, 56 form a smaller soldering surface, but the distance between the end portions 52 of the two rows of leads 54, 56 is increased. FIG. 6b illustrates another embodiment of a package 60 wherein longer leads 64, 66 are used to form end portions 62 that are farther away from the mounting edge 63 of the package.

Although the present invention has been described in detail, it should be understood that various changes, substitutions, and alterations can be made hereto without departing from the spirit and scope of the invention as defined by the following claims.

What is claimed is:

1. A method for making a semiconductor package having interdigitated leads, the method comprising the steps of:
   providing a semiconductor package having two generally parallel and opposing rows of conductive leads, each row having a spacing between adjacent pairs of leads, wherein the two rows of leads extend from one side of the package, each lead having an unconnected end, and
   shaping each of the two rows of leads to extend toward the other row in an interdigitating and non-contacting configuration.

2. The method of claim 1, wherein the two rows of leads are positioned on the side of the package such that the leads on one row are positioned between the spacings of the leads on the other row.

3. The method of claim 1, wherein the step of shaping the two rows of leads includes the steps of:
   bending the leads of each row toward the other row; and
   positioning the leads of each row within the spacings of the leads of the other row.

4. The method of claim 1, and further comprising:
   bending the unconnected ends of the leads to form a contact surface that is generally parallel to the side of the package where the leads are disposed for soldering to a printed circuit board.

* * * * *